(12) United States Patent
Ohta et al.

(10) Patent No.: US 8,295,015 B2
(45) Date of Patent: Oct. 23, 2012

(54) MAGNETORESISTIVE ELEMENT, THIN FILM MAGNETIC HEAD, MAGNETIC HEAD SLIDER, HEAD GIMBAL ASSEMBLY, HEAD ARM ASSEMBLY AND MAGNETIC DISK DEVICE

(75) Inventors: Naoki Ohta, Tokyo (JP); Hiroshi Yamazaki, Tokyo (JP); Kosuke Tanaka, Tokyo (JP); Takayasu Kanaya, Tokyo (JP); Kei Hirata, Tokyo (JP)

(73) Assignee: TDK Corporation, Tokyo (JP)

( * ) Notice: Subject to any disclaimer, the term of this patent is extended or adjusted under 35 U.S.C. 154(b) by 892 days.

(21) Appl. No.: 12/320,878

(22) Filed: Feb. 6, 2009

(65) Prior Publication Data

US 2010/0202088 A1    Aug. 12, 2010

(51) Int. Cl.
*G11B 5/39* (2006.01)
(52) U.S. Cl. .................................. 360/324.12
(58) Field of Classification Search ........... 360/324.11–324.12, 327.2–327.33
See application file for complete search history.

(56) References Cited

U.S. PATENT DOCUMENTS

| 5,766,743 A * | 6/1998 | Fujikata et al. ............ 428/212 |
| 6,074,743 A * | 6/2000 | Araki et al. ................ 428/332 |
| 2001/0040781 A1* | 11/2001 | Tanaka et al. ............ 360/324.12 |
| 2004/0217082 A1* | 11/2004 | Claessens ..................... 215/249 |
| 2005/0030676 A1* | 2/2005 | Fukuzawa et al. ............ 360/325 |
| 2006/0198059 A1* | 9/2006 | Sakai et al. ............... 360/324.12 |
| 2008/0198515 A1* | 8/2008 | Miyauchi et al. ........ 360/324.11 |

FOREIGN PATENT DOCUMENTS

| JP | A-2003-086860 | 3/2003 |
| JP | A-2004-031545 | 1/2004 |
| JP | A-2005-109241 | 4/2005 |
| JP | A-2006-179566 | 7/2006 |

* cited by examiner

*Primary Examiner* — Craig A. Renner
*Assistant Examiner* — Adam B Dravininkas
(74) *Attorney, Agent, or Firm* — Oliff & Berridge, PLC

(57) ABSTRACT

The invention is devised to provide a magnetoresistive element that is hardly susceptible to harmful influence of unnecessary magnetic fields and noise of heat even when reduction in size is achieved to be adaptable to higher recording density, and therefore that is excellent in operational reliability. The magnetoresistive element includes a stacked structure including, in order: a magnetically pinned layer whose magnetization direction is fixed in a given direction; a non-magnetic layer; a magnetically free layer whose magnetization direction changes according to an external magnetic field; and an antiferromagnetic bias layer exchange-coupled with the magnetically free layer. The exchange-coupling magnetic field between the magnetically free layer and the antiferromagnetic bias layer is smaller than a saturation magnetic field of the magnetically free layer.

11 Claims, 8 Drawing Sheets

MAGNETORESISTIVE ELEMENT, THIN FILM MAGNETIC HEAD, MAGNETIC HEAD SLIDER, HEAD GIMBAL ASSEMBLY, HEAD ARM ASSEMBLY AND MAGNETIC DISK DEVICE

BACKGROUND OF THE INVENTION

1. Field of the Invention

The present invention relates to a magnetoresistive element exhibiting giant magnetoresistive effect, and a thin film magnetic head, magnetic head slider, head gimbal assembly, head arm assembly and a magnetic disk device provided with the magnetoresistive element.

2. Description of the Related Art

A thin film magnetic head, which includes a magnetoresistive element (MR element) exhibiting magnetoresistive effect (MR effect), is widely used for reading out information written on magnetic recording media such as a hard disk. Recently, a thin film magnetic head including a giant magnetoresistive element (GMR element) exhibiting giant magnetoresistive (GMR) effect is more general because of increasing recording density of magnetic recording media. Examples of such GMR element include a spin valve GMR element (SV-GMR element).

The SV-GMR element is configured as a stacked layer in which a magnetic layer whose magnetization direction is fixed in a given direction (magnetically pinned layer) and a magnetic layer whose magnetization direction is varied in accordance with an external signal magnetic field applied from outside (magnetically free layer) are stacked with a nonmagnetic interlayer in between. In particular, those configured to make a read current flow in a direction along a stacking plane of the element during reading operation is called CIP-GMR element (Current in Plane GMR element). Further, a thin film magnetic head including the CIP-GMR element is called CIP-GMR head. In this configuration, electric resistance (namely, voltage) is varied when the read current is applied in accordance with a relative angle between the magnetization directions of the two magnetic layers (the magnetically pinned layer and the magnetically free layer).

To comply with higher recording density of magnetic recording media in recent years, CPP (Current Perpendicular to the Plane)-GMR head, which includes a CPP-GMR element that is configured to allow read current to flow in a direction orthogonal to the staking plane during reading operation, has been developed. Such CPP-GMR head generally includes a GMR element, a pair of magnetic domain controlling layers that are arranged to face each other in a track-width direction, sandwiching the GMR element with an insulating layer in between, and a bottom electrode and a top electrode that are arranged to face each other with the GMR element and the pair of magnetic domain controlling layers in between in a stacking direction. The upper and lower electrodes also serve as top and bottom shielding layers, respectively. Such CPP-GMR head has an advantage in that high power is available when reducing the dimension of element in the read track width direction, as compared with the CIP-GMR head. Namely, in the CIP-GMR head, since read current flows in a direction along the stacking plane of the element, dimensional reduction in the read track width direction results in the narrowing of magnetic sensitive area through which the read current passes, thereby decreasing the amount of change in voltage. On the other hand, since read current passes through the CPP-GMR head in the stacking direction, the dimensional reduction in the read track width direction less affects the amount of change in voltage. For this reason, the CPP-GMR head is advantageous compared with the CIP-GMR head in view of reduction of track density, whose unit is "TPI" (tracks per inch). What is more, since insulating layers are omitted between the CPP-GMR element and top/bottom shielding layers, that allows the reduction, by the thickness of the omitted insulating layers, of the linear recording density, whose unit is BPI (bit per inch), as compared with the CIP-GMR head.

There is also a tunnel MR element (TMR element) that is configured similar to the CPP-GMR element in that the read current flows in the direction orthogonal to the stacking plane. This TMR element includes an ultra-thin insulating layer called tunnel barrier layer so as to obtain much higher resistance change ratio than that of the above-mentioned CPP-GMR element. For this reason, the thin film magnetic head including the TMR element (TMR head) is highly expected to comply with a further improvement of recording density.

As disclosed in JP2004-31545A, JP2006-49358A, or JP2006-179566A, for example, for the purpose of giving more uniform bias magnetic field to a magnetically free layer in the track width direction, GMR element with what is called in-stack bias structure, in which one magnetic domain controlling layer is stacked on a magnetically free layer instead of a pair of magnetic domain controlling layers arranged to sandwich the GMR element in the track width direction, is proposed.

SUMMARY OF THE INVENTION

However, these days reduction of record bit size in the magnetic recording medium is still in progress to meet increasing requirements of much higher recording density, so there is a tendency that the size of magnetoresistive elements is remarkably reduced. Accordingly, magnetoresistive elements can detect a signal magnetic field weaker than before but it is more susceptible to influence of unnecessary magnetic field applied from outside and thermal energy. Accordingly, there is a demand for a magnetoresistive element that is hardly susceptible to harmful influence of unnecessary magnetic fields and noise of heat even when reduction in size is achieved.

In view of the drawback of the invention, it is desirable to provide a magnetoresistive element which is excellent in operational reliability while complying with higher recording density, and a thin film magnetic head, magnetic head slider, head gimbal assembly, head arm assembly, and magnetic disk device provided with the magnetoresistive element.

A first magnetoresistive element of an embodiment of the present invention includes a stacked structure in which a magnetically pinned layer whose magnetization direction is fixed in a given direction, a non-magnetic layer, a magnetically free layer whose magnetization direction changes according to an external magnetic field, and an antiferromagnetic bias layer exchange-coupled with the magnetically free layer are stacked in order, and an exchange-coupling magnetic field between the magnetically free layer and the antiferromagnetic bias layer is smaller than a saturation magnetic field where the magnetization of the magnetically free layer is saturated. A thin film magnetic head of an embodiment of the present invention includes the above-mentioned magnetoresistive element and a pair of magnetic shielding layers arranged to face each other, in a stacking direction, with the magnetoresistive element in between. A magnetic head slider of an embodiment of the present invention includes the above-mentioned thin film magnetic head mounted on a substrate. A head gimbal assembly of an embodiment of the present invention includes the above-mentioned magnetic head slider of the present invention attached to a suspension on one end of the suspension. A head arm assembly of an embodiment of the present invention includes a suspension attached to the magnetic head slider of the present invention on one end of the suspension and an arm supporting the other end of the suspension. A magnetic disk device of an embodiment of the present invention includes the above-mentioned head arm assembly of the present invention, with a magnetic recording medium.

In the first magnetoresistive element of an embodiment of the present invention, the thin film magnetic head, the magnetic head slider, the head gimbal assembly, the head arm assembly and the magnetic disk device including the magnetoresistive element, since the exchange-coupling magnetic field between the magnetically free layer and the antiferromagnetic bias layer is smaller than the saturation magnetic field where the magnetization of the magnetically free layer is saturated, variation in the magnetization of the free layer according to an external magnetic field (signal magnetic field) is more gentle in an area where the magnitude of magnetic field is smaller than the above-mentioned exchange-coupling magnetic field within a range from zero magnetic field to saturation magnetic field where the magnetization of the free layer is saturated. Namely, the magnetization movement of the free layer is restricted, and weak noise signals hardly influence the magnetization direction of the free layer. Meanwhile, in an area where the magnitude of magnetic field is larger than the above-mentioned exchange-coupling magnetic field, magnetization of the free layer reacts sensitively to an external magnetic field (signal magnetic field). Accordingly, magnetization of the free layer is oriented with sensitivity when the external magnetic field (signal magnetic field) applied to the free layer is larger than a specified magnitude.

A second magnetoresistive element of an embodiment of the present invention includes a stacked structure in which a magnetically pinned layer whose magnetization direction is fixed in a given direction, a non-magnetic layer, a magnetically free layer whose magnetization direction changes according to an external magnetic field, and an antiferromagnetic bias layers exchange-coupled with the magnetically free layer are stacked in order, and a curve which represents a variation in magnetization of the magnetically free layer versus an external magnetic field includes a first magnetic field range and a second magnetic field range, within a range from the saturation magnetic field where the magnetization of the magnetically free layer is saturated to zero magnetic field. The first magnetic field range is defined as a range from the saturation magnetic field via a portion with a maximum gradient to a relay point, and the second magnetic field range is defined as a range from the relay point to the zero magnetic field. Gradient in the second magnetic field range is smaller than that of the first magnetic field range.

In the second magnetoresistive element of an embodiment of the present invention, the variation in magnetization of the magnetically free layer in accordance with an external magnetic field is more gentle in the second magnetic field range including the zero magnetic field among the range from the zero magnetic field to the saturation magnetic field because of the exchange-coupling between the magnetically free layer and the antiferromagnetic bias layer. Namely, the magnetization movement of the magnetically free layer is restricted, and weak noise signals hardly influence the magnetization direction of the magnetically free layer. Meanwhile, in the first magnetic field range where magnitude of the magnetic field is larger than the second magnetic field range, magnetization of the magnetically free layer reacts sensitively to an external magnetic field. Accordingly, magnetization of the magnetically free layer is oriented with sensitivity if magnitude of the external magnetic field applied to the magnetically free layer is larger than a given magnitude.

Accordingly, the first and second magnetoresistive elements of an embodiment of the present invention is hardly susceptible to harmful influence of unnecessary magnetic fields and noise of heat even when reduction in size is achieved. As a result, a thin film magnetic head, magnetic head slider, head gimbal assembly, head arm assembly, and magnetic disk device provided with the magnetoresistive element can detect signal magnetic fields with high reliability while being adaptable to higher recording density.

Other objects, features and effects of the present invention will be explained as necessary in the following descriptions.

DETAILED DESCRIPTION OF THE PREFERRED EMBODIMENTS

Embodiment of the present invention will be described in detail hereinbelow with reference to the drawings.

First, configuration and operation of a thin film magnetic head provided with a magnetoresistive element according to an embodiment of the present invention and a magnetic head slider, head gimbal assembly, head arm assembly and magnetic disk device provided with the thin film magnetic head will be described hereinbelow with reference to FIGS. 1 to 6.

Figure 1:
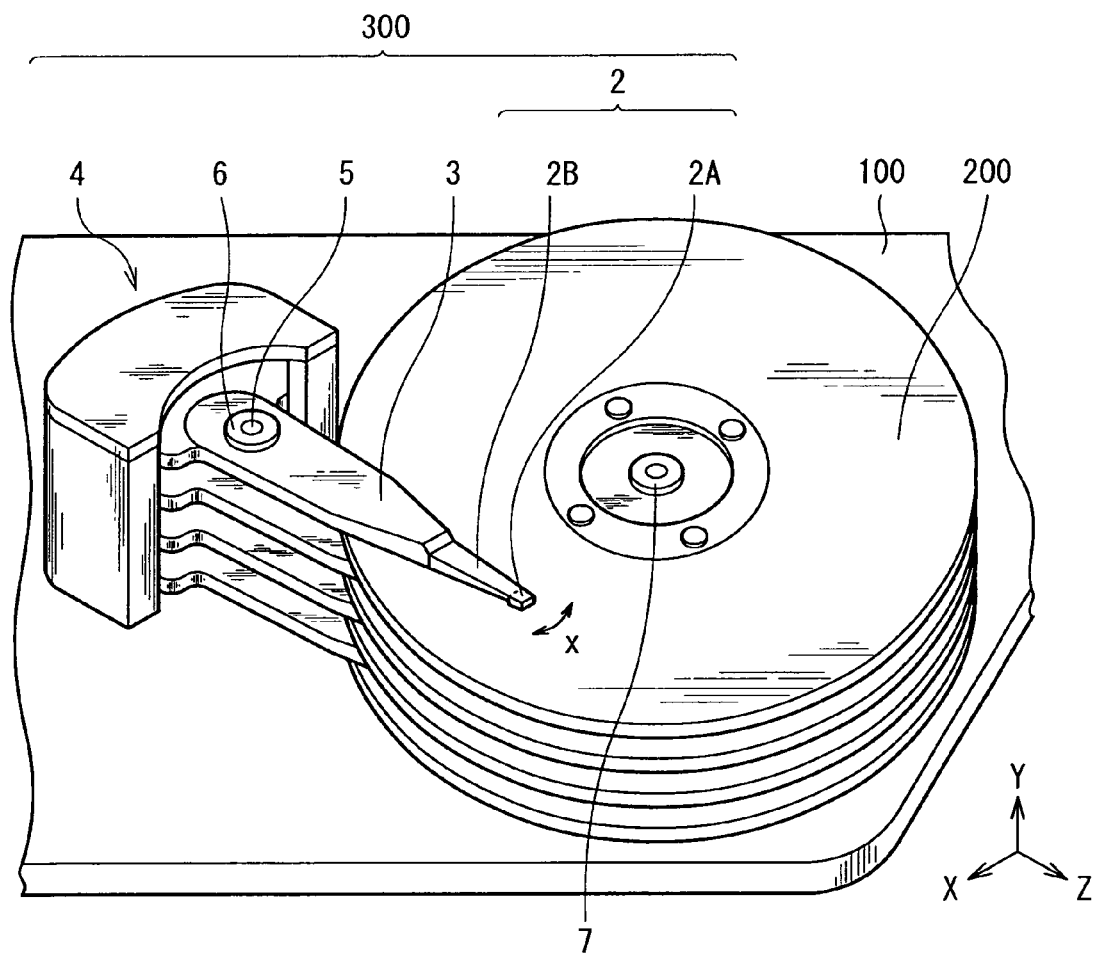
FIG. 1 is a perspective view showing a configuration of magnetic disk device that includes a thin film magnetic head according to an embodiment of the present invention.

FIG. 1 is a perspective view showing an internal configuration of the magnetic disk device according to the present embodiment. The magnetic disk device includes, inside a housing 100 for example, a magnetic recording medium 200 that works as a magnetic recording medium on which information is written, and a head arm assembly (HAA) 300 that writes information onto the magnetic recording medium 200 and reads it out as shown in FIG. 1. The HAA 300 includes a head gimbal assembly (HGA) 2, an arm 3 supporting a base portion of the HGA2, and an actuator 4 that works as a power source for rotating the arm 3. The HGA2 includes a magnetic head slider 2A (hereinafter referred to as "slider") having an after-mentioned thin film magnetic head 1 of the present embodiment on one side-face thereof, and a suspension 2B having the slider 2A attached to one end thereof. The other end (on a side opposite to the slider 2A) of the suspension 2B is supported by the arm 3. The arm 3 is configured to rotate on a fixed axle 5 which is fixed to the housing 100, via a bearing 6. The actuator 4 is, for example, configured of a voice coil motor or the like. Usually, the magnetic disk device includes a plurality of the magnetic recording media 200 and a plurality of the sliders 2A are arranged corresponding to recording surfaces (upper surface and rear surface) of the respective magnetic recording media 200 as shown in FIG. 1. Each of the sliders 2A is movable in a direction across the read track (the direction of X) on a plane parallel to the recording surface of the respective magnetic write media 200. Meanwhile, the magnetic recording medium 200 rotates on a spindle motor 7 that is fixed to the housing 100, in a direction approximately orthogonal to the direction of X. Thus information is written on the magnetic recording medium 200 and read out therefrom by rotation of the magnetic recording medium 200 and transverse motion of the slider 2A.

Figure 2:
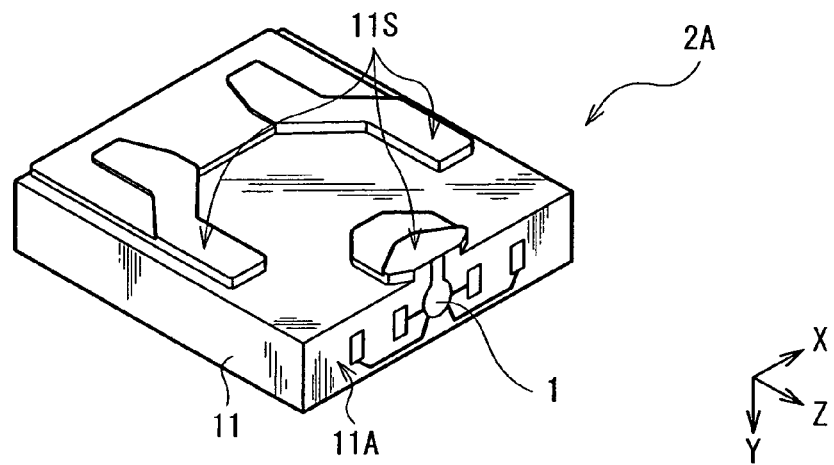
FIG. 2 is a perspective view showing a configuration of a slider in the magnetic disk device appearing in FIG. 1.

FIG. 2 shows a configuration of the slider 2A appearing in FIG. 1. The slider 2A includes a block-shaped substrate 11 made of altics ($Al_2O_3$.TiC), for example. The substrate 11 is approximately hexahedral in shape, for example, and is arranged so that one side face thereof is closely facing the recording surface of the magnetic recording medium 200. The side face facing the recording surface of the magnetic recording medium 200 is called recording-medium-facing-surface 11S, which is also called air bearing surface (ABS). When the magnetic recording medium 200 rotates, the slider 2A floats from the recording surface in a direction away from the recording surface (the direction of Y) by lift caused by an airflow between the recording surface and the recording-medium-facing-surface 11S so that there is a given space between the recording-medium-facing-surface 11S and the magnetic recording medium 200. A thin film magnetic head 1 is disposed on an element formation face 11A, which is one of the side-faces of the substrate 11 with respect to the recording-medium-facing-surface 11S.

Figure 3:
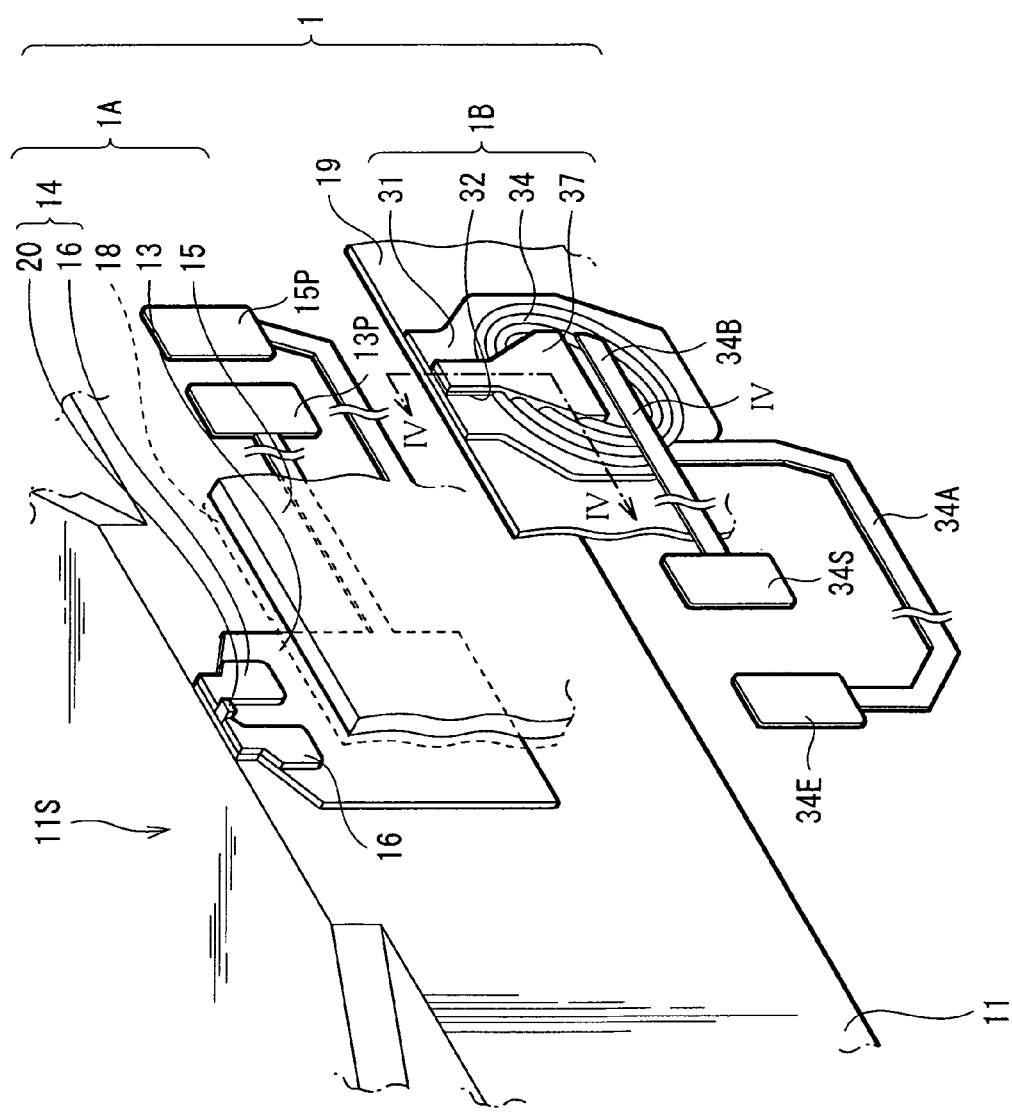
FIG. 3 is an exploded perspective view showing a configuration of the thin film magnetic head appearing in FIG. 1.
Figure 4:
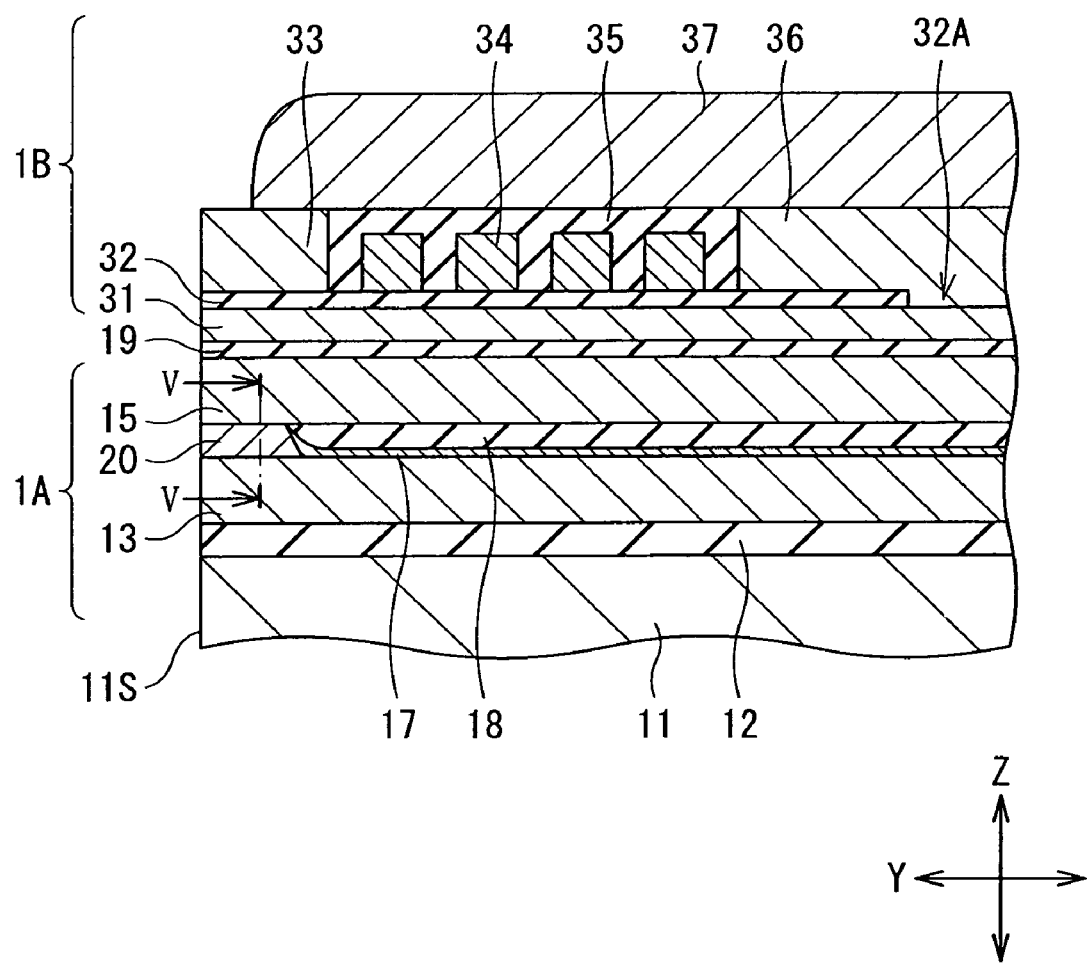
FIG. 4 is a sectional view showing a configuration of the thin film magnetic head appearing in FIG. 3, taken along the line IV-IV, as viewed from the direction indicated by arrows.
Figure 5:
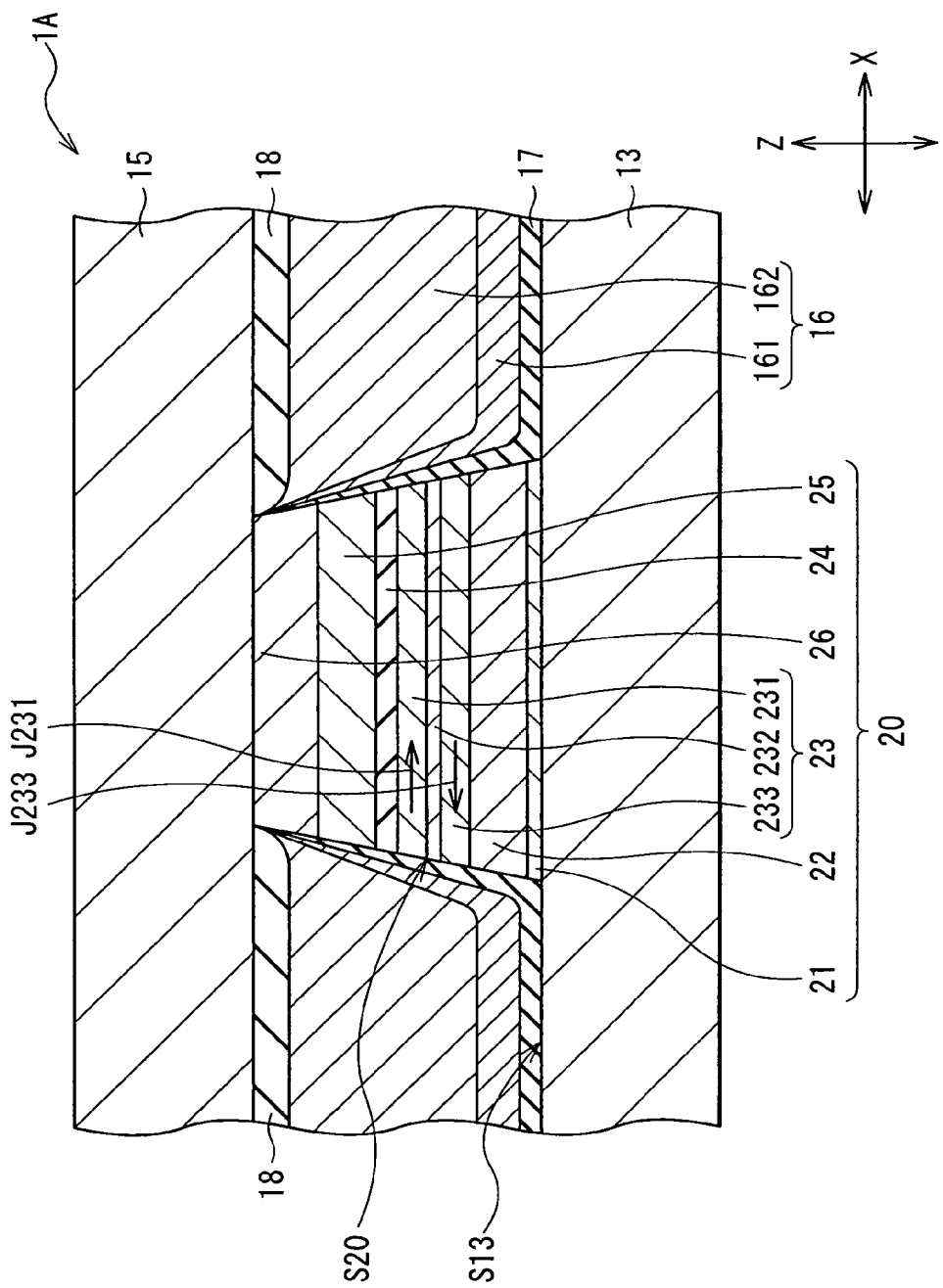
FIG. 5 is an enlarged cross section showing a principal portion of an MR element appearing in FIG. 3.

FIG. 3 is an exploded perspective view showing a disassembled configuration of the thin film magnetic head 1. FIG. 4 is a sectional view showing a configuration of the thin film magnetic head appearing in FIG. 3, taken along the line IV-IV, as viewed from the direction indicated by arrows. As shown in FIGS. 3 and 4, the thin film magnetic head 1 is integrally constituted from a read head section 1A which reads magnetic information written on the magnetic recording medium 200 and a write head section 1B which writes magnetic information on a write track of the magnetic recording medium 200. FIG. 5 is a sectional view showing a principal portion of the read head portion 1A on the recording medium facing surface 11S.

As shown in FIGS. 3 to 5, the read head section 1A includes a tunneling magnetoresistive element (hereinafter referred to as TMR element) 14 having the CPP (current perpendicular to the plane) structure, in which sensing current flows in a stacking direction of TMR layers. Specifically, for example, on the substrate 11, a bottom shielding layer 13, the TMR element 14, and a top shielding layer 15 are stacked in order with an insulating layer 12 (shown in FIG. 4) between the substrate 11 and a bottom shielding layer 13. The TMR element 14 has a multilayered TMR film 20, and a pair of ferromagnetic bias layers 16 arranged to face each other in a track width direction with the TMR film 20 in between.

The bottom shielding layer 13 and the top shielding layer 15 are, for example, formed to the thickness of 1 to 3 μm respectively, and made of a soft magnetism metal material such as nickel-iron alloy (NiFe). These bottom shielding layer 13 and top shielding layer 15 are facing each other with the TMR film 20 in between in the stacking direction (the direction of Z) so as to prevent the TMR film 20 from being affected by unnecessary magnetic fields. The bottom shielding layer 13 is connected to a pad 13P and the top shielding layer 15 is connected to a pad 15P so that they also function as a current path for applying sensing current to the TMR film 20 in the stacking direction (the direction of Z).

The TMR film 20 is configured as a stacked structure in which a plurality of conductive layers including a magnetic material layer are stacked, with a tunnel barrier layer in between as shown in FIG. 5, and functions as a sensor portion to read magnetic information written on the magnetic recording medium 200. Specifically, a foundation layer 21, a pinning layer 22, a synthetic antiferromagnetic (SyAF) pinned layer 23, a tunnel barrier layer 24, a free layer 25, and an antiferromagnetic bias layer 26 are stacked in order from the side of the bottom shielding layer 13.

The foundation layer (it is also called buffer layer.) 21 is, for example, structured in such a manner that a tantalum (Ta) layer (1 to 3 nm in thickness) and ruthenium (Ru) layer (1 to 3 nm in thickness) are stacked, and functions so as to support exchange-coupling between the pinning layer 22 and the SyAF pinned layer 23 (more accurately, a second magnetically pinned film 233 as mentioned later).

The pinning layer 22 is, for example, made of an antiferromagnetic material such as platinum-manganese alloy (PtMn) or iridium-manganese alloy (IrMn), with a thickness of 4 to 20 nm for example. The pinning layer 22 functions as what is called a pinning layer for fixing the magnetization direction of the SyAF pinned layer 23.

The SyAF pinned layer 23 is configured as a trilaminar structure of what is called synthetic structure, in which a first magnetically pinned film 231, a nonmagnetic film 232, and a second magnetically pinned film 233 are stacked in order from the side far from the pinning layer 22 (namely, from the side near the free layer 25). The first magnetically pinned film 231 shows a magnetization J231 that is fixed in a given direction, with a thickness of 2 to 4 nm, for example. The nonmagnetic film 232 consists of a non-magnetic metal material, such as copper, ruthenium, rhodium (Rh), or iridium (Ir), with a thickness of 0.8 nm, for example. The second magnetically pinned film 233 shows a magnetization J233 fixed in a direction opposite to the magnetization J231, with a thickness of 2 to 4 nm for example. The first and second magnetically pinned films 231 and 233 are antiferromagnetically exchange-coupled with the nonmagnetic film 232 in between, and the direction of magnetizations J231 and J233 are fixed by the antiferromagnetic layer 22.

The first magnetically pinned film 231 may be basically made of a ferromagnetic material including iron (Fe), cobalt (Co), nickel (Ni), etc., for example, and may be configured either as a monolayer structure or as a multilayer structure. For example, it may be structured as a monolayer made of CoFe, or may be structured by repeatedly stacking a CoFe layer and a copper layer alternately. As described later, since magnetoresistive effect (MR effect) is expectable also in the interface of magnetic substance and nonmagnetic substance, improvement in the resistance variation by MR effect is expected by making a multilayer structure such as "CoFe/Cu" as mentioned above. The first magnetically pinned film 231 may include Heusler alloy. The Heusler alloy mentioned here is an alloy with compositional formula $X_2YZ$ (where X and Y are transition metal elements and Z is a semiconductor or non-magnetic metal) having a crystal structure symbolized by $L_{21}$, $B_2$, or with compositional formula $X_2YZ$ having a crystal structure symbolized by $C_{12}$. For example, iron, cobalt, nickel, copper, zinc (Zn), etc. are used as X, and manganese (Mn), chromium (Cr), etc. are used as Y, and aluminum, silicon, gallium (Ga), germanium (Ge), indium (In), tin (Sn), thallium (Tl), lead (Pb), antimony (Sb), etc. are used as Z.

The second magnetically pinned film 233 is basically made of a ferromagnetic material including at least one of iron, cobalt, and nickel, for example. The second magnetically pinned film 233 may further include tantalum (Ta), chromium, vanadium (V), etc. as additive, for example. As with the first magnetically pinned film 231, the second magnetically pinned film 233 may be also configured either as a monolayer or as a multilayer structure. For example, it may be a monolayer made of such components as a cobalt-iron-tantalum alloy (CoFeTa), cobalt-iron-nickel-chrome alloy (CoFeNiCr), cobalt-iron-chromium alloy (CoFeCr) or cobalt-iron-vanadium alloy (CoFeV). Alternatively, it may be a multilayer structure in which some monolayers made of different components such as CoFe, Ta, NiCr, FeCr, or FeV are stacked (for example, "CoFe/Ta", "CoFe/FeCr", "CoFe/FeV", and so on).

The tunnel barrier layer 24 is primarily made of a nonmagnetic insulating material, which is obtained by oxidizing a metal such as magnesium and aluminum. The thickness of the tunnel barrier layer 24 is very thin, with a thickness of 0.5 to 4 nm for example. The tunnel barrier layer 24 mainly functions to cancel out the magnetic coupling of the free layer 25 and the SyAF pinned layer 23 (the first magnetically pinned film 231) and produce a tunnel effect.

The free layer 25 is located on the side opposite to the second magnetically pinned film 233 with the first magnetically pinned film 231 in between. It is preferred that the free layer 25 has a double layer structure constituted from a nickel iron alloy (NiFe) layer and a cobalt iron alloy (CoFe) layer for example. Magnetization direction of the free layer 25 varies according to the direction and magnitude of external magnetic field (in the present embodiment, signal magnetic field from the magnetic recording medium 200). The free layer 25 may be a monolayer made of a ferromagnetic material such as CoFe and NiFe. Further, the free layer 25 may include a Heusler alloy.

The antiferromagnetic bias layer 26 is made of an antiferromagnetic material such as PtMn and IrMn for example as with the pinning layer 22, with a typical thickness of, for example, 4 to 20 nm. The antiferromagnetic bias layer 26 is antiferromagnetically exchange-coupled with the free layer 25 when a signal magnetic field is zero (zero magnetic field) or around the zero magnetic field, and functions to restrict variation in the magnetization direction of the free layer 25.

The ferromagnetic bias layer 16 is configured of a foundation layer 161 formed on the bottom shielding layer 13 with an insulating layer 17 in between and a magnetic domain controlling layer 162 formed on the foundation layer 161. The ferromagnetic bias layers 16 are arranged to face each other with the TMR film 20 in between in the direction of X (the direction corresponding to a read track width) so as to apply a longitudinal bias magnetic field to the free layer 25. More concretely, the foundation layer 161 is, for example, made of chromium titanium alloy (CrTi) or tantalum, and functions to improve growth of the magnetic domain controlling layers 162 in its production process. The magnetic domain controlling layer 162 is, for example, made of cobalt-platinum alloy (CoPt) etc., and functions to promote single domainization of the free layer 25 and suppress generation of a Barkhausen noise.

The end face S20 of the TMR film 20 is covered with the insulating layer 17. The insulating layer 17 continuously covers a portion from the surface S13 of the bottom shielding layer 13 to the end face S20 of the TMR film 20 so as to electrically insulate the TMR film 20 and the bottom shielding layer 13 from the pair of ferromagnetic bias layers 16. Namely, the insulating layer 17 accurately defines an electrical path for sensing current so as to prevent the sensing current from leaking out of the TMR film 20 (with reference to FIG. 5). The pair of ferromagnetic bias layers 16 are covered with an insulating layer 18. The insulating layer 18 is provided so as to surround the periphery of the TMR film 20 in the XY plane except the recording-medium-facing-surface 11S. More concretely, the insulating layer 18 is constituted from two portions, one of which covers the pair of ferromagnetic bias layers 16 and is arranged to face each other with the TMR film 20 in between in the direction of X, and the other of which covers the insulating layer 17 and occupies an area located on the side opposite to the recording-medium-facing-surface 11S with the TMR film 20 in between (with reference to FIG. 4). Both of the insulating layers 17 and 18 are made of nonmagnetic insulating material such as aluminium oxide ($Al_2O_3$) and alumimium nitride (AlN).

Next, reading operation of the read head section 1A that is configured as described above will be explained with reference to FIG. 6 in addition to FIGS. 3 to 5. In the thin film magnetic head 1, information written on the magnetic recording medium 200 is read out by the read head section 1A. When reading the written information, the signal magnetic field from the magnetic recording medium 200 reaches the TMR element 14, with the recording-medium-facing-surface 11S facing a recording surface of the magnetic recording medium 200. In this state, a sensing current is flown to the TMR film 20 in advance in the stacking direction (the direction of Z) via the bottom shielding layer 13 and the top shielding layer 15. Namely, the sensing current is applied through the foundation layer 21, the pinning layer 22, the SyAF pinned layer 23, the tunnel barrier layer 24, the free layer 25 and the antiferromagnetic bias layer 26 in this order or vice versa in the inside of the TMR film 20. In the TMR film 20, magnetization direction is relatively changed between the free layer 25 whose magnetization direction is changed with signal magnetic fields and the SyAF pinned layer 23 whose magnetization direction is mostly fixed in a given direction by the pinning layer 22 without being affected by the signal magnetic fields. As a result, change occurs in the spin-dependent scattering of conduction electrons, and electric resistance of the TMR film 20 is varied. Since such variation in electric resistance brings about variation in output voltage (change in sensing current), information written on the magnetic recording medium 200 is read out by detecting the variation.

Figure 6A:
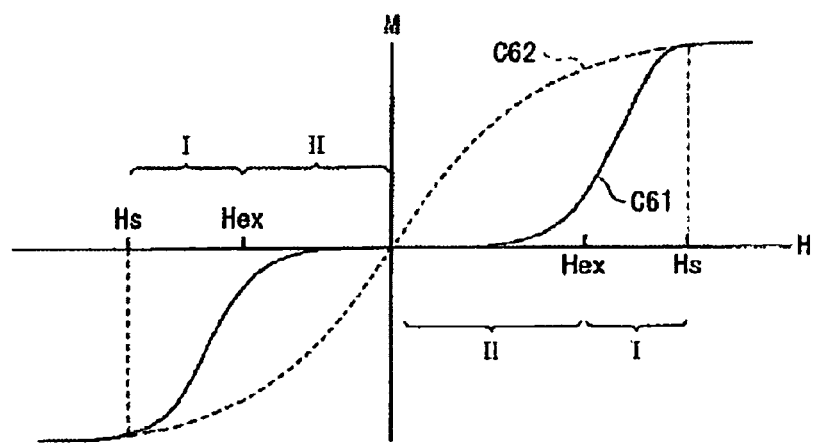
FIG. 6A is a characteristic chart showing magnetization M of a free layer that varies in accordance with magnetic field H applied from outside.

According to the present embodiment, since the free layer 25 and the antiferromagnetic bias layer 26 are antiferromagnetically exchange-coupled at around the zero magnetic field, the TMR film exhibits behavior different from those of related arts. FIG. 6A is a characteristic chart showing a variation of magnetization M of the free layer when an external magnetic field H is applied from outside (including the signal magnetic field Heff from the magnetic recording medium 200). In FIG. 6A, the abscissa represents magnitude of external magnetic field H, and the ordinate represents magnitude of magnetization M of the free layer. Curve C61 drawn with a solid line represents behavior of the free layer 25 of the TMR film 20 according to the present embodiment. Meanwhile, curve C62 drawn with a broken line represents behavior of a free layer of a TMR element having a general CPP structure, in which the antiferromagnetic bias layer is not provided adjacent to the free layer.

As shown in FIG. 6A, the curve C61 corresponding to the TMR film 20 of the present embodiment includes two types of magnetic field ranges I and II within a range from saturation magnetic field Hs (a magnetic field where the free layer exhibits saturation magnetization) to the zero magnetic field (H=0). The first magnetic field range I is defined as a range from the saturation magnetic field Hs via a portion of a maximum gradient to an exchange-coupling magnetic field Hex (to be described later) for the free layer 25 and the antiferromagnetic bias layer 26. The second magnetic field range II is defined as a range from the exchange-coupling magnetic field Hex to the zero magnetic field, remaining a smaller gradient value than that of the first magnetic field range I. Namely, in the range along the abscissa from the zero magnetic field to the saturation magnetic field Hs, the curve C61 includes the second magnetic field range II from the zero magnetic field to the exchange-coupling magnetic field Hex in which the magnetization M exhibits comparatively gradual variation, and the first magnetic field range I from the exchange-coupling magnetic field Hex to the saturation magnetic field Hs in which the magnetization M exhibits comparatively rapid variation. Accordingly, in the second magnetic field range II, the exchange-coupling between the free layer 25 and the antiferromagnetic bias layer 26 is dominant, and magnetization transition of the free layer 25 is restricted by the antiferromagnetic bias layer 26 and stabilized. Therefore, variation of the magnetization direction in the free layer 25 is insusceptible to a harmful influence of weak noise signals other than the signal magnetic field, and misinformed reading is prevented. Meanwhile in the first magnetic field range I, the exchange-coupling between the free layer 25 and the antiferromagnetic bias layer 26 disappears, and magnetization transition of the free layer 25 is no more susceptible to restrictions. Accordingly, magnetization of the free layer 25 reacts sensitively to the variation of the magnetic field Heff, and the magnetic field Heff is detected with high precision through variation of output voltage (change in sensing current).

On the other hand, the curve C62 corresponding to free layer of TMR element of related arts has a maximum gradient around the zero magnetic field while having a smaller gradient value around the saturation magnetic field Hs. Accordingly, around the zero magnetic field, magnetization of the free layer is sensitive to the signal magnetic field Heff and is also very susceptible to harmful influence of weak noise signals other than the signal magnetic field. As a result, it is difficult to detect the signal magnetic field Heff with high precision. In the GMR element with in-stack bias structure disclosed by the above-mentioned JP2004-31545A, JP2006-49358A, and JP2006-179566A etc., since the bias magnetic field applied to the free layer from the magnetic domain controlling layer is set up larger than the saturation magnetic field of the free layer, magnetization of the free layer is restrained more or less by the magnetic domain controlling layer in all over the range from the zero magnetic field to the saturation magnetic field. That results in rather inferior responsiveness to the signal magnetic field Heff to be detected.

Figure 6B:
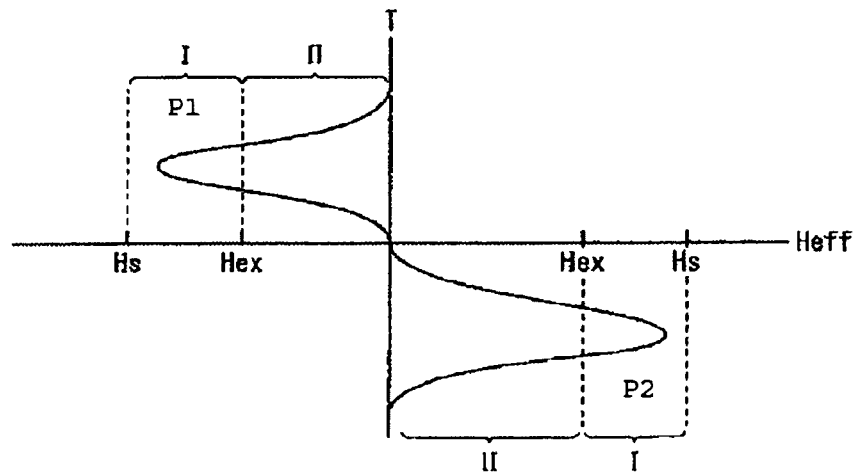
FIG. 6B is a characteristic chart showing a temporal variation (reproduced waveform) in a signal magnetic field Heff applied from a magnetic recording medium to a free layer.

FIG. 6B is a characteristic chart showing a temporal variation (reproduced waveform) in the signal magnetic field Heff applied from the magnetic recording medium 200 to the free layer 25. In FIG. 6B, the abscissa represents magnitude of the signal magnetic field Heff, and the ordinate represents elapsed time. The reproduced waveform has peak values P1 and P2 of signal magnetic field Heff higher than the exchange-coupling magnetic field Hex on the abscissa. As mentioned above, as far as the signal magnetic field Heff applied to the free layer 25 has a given magnitude or larger (magnitude corresponding to the first magnetic field range I), magnetization of the free layer 25 is oriented with high sensitivity.

Next, configuration of the write head section 1B will be described. As shown in FIGS. 3 and 4, the write head section 1B is formed on the read head portion 1A with an insulating layer 19 in between, and includes a lower magnetic pole 31, a write gap layer 32, a pole chip 33, a coil 34, an insulating layer 35, a connection point 36 and an upper magnetic pole 37. The insulating layer 19 is made of a nonmagnetic insulating material such as $Al_2O_3$ or AlN.

The lower magnetic pole 31 is, for example, made of a magnetic material such as NiFe, and is formed on the insulating layer 19. The write gap layer 32 is made of a nonmagnetic insulating material such as $Al_2O_3$ or AlN, and is formed on the lower magnetic pole 31. The write gap layer 32 has an opening 32A in a portion facing the center, on the XY plane, of the coil 34 to form a magnetic path. On the write gap layer 32 are formed the pole chip 33, the insulating layer 35, and the connection point 36 in a same plane in order from the side near the recording-medium-facing-surface 11S. The coil 34 is buried in the insulating layer 35. The coil 34 is windingly disposed on the write gap layer 32 with the center of its winding aligned to the center of the opening 32A, and is, for example, made of copper (Cu) or gold (Au). Most part of the coil 34, except its end portions, is covered with the insulating layer 35 made of photoresist etc. Both ends of the coil 34 are connected to pads 34E and 34S via coil leads 34A and 34B respectively (with reference to FIG. 3). The upper magnetic pole 37 is, for example, made of a soft magnetic material with high saturation flux density such as NiFe, and is formed above the write gap layer 32, the pole chip 33, the insulating layer 35, and the connection point 36 (with reference to FIG. 4). The upper magnetic pole 37 is in contact with the lower magnetic pole 31 via the opening 32A and magnetically connected to the lower magnetic pole 31. Although not illustrated, an overcoat layer made of a nonmagnetic insulating material such as $Al_2O_3$ covers all over the upper surface of the write head section 1B.

In the write head section 1B configured in such a manner, magnetic flux is generated in the magnetic path that is mainly constituted from the lower magnetic pole 31 and the upper magnetic pole 37, when write current is applied into the coil 34. With such magnetic flux, a signal magnetic field is generated around the write gap layer 32, thereby magnetizing a specified region of the magnetic recording medium 200 to write information thereon.

Next, a method of manufacturing the thin film magnetic head 1 will be explained with reference to FIGS. 7 to 10. Here, a step of forming the read head section 1A including the TMR element 14 is mainly explained in detail.

The method of manufacturing the thin film magnetic head according to the present embodiment includes the respective manufacturing steps of (A) to (G) as follows.

(A) A step of forming the bottom shielding layer 13 on the substrate 11 with the insulating layer 12 in between.

(B) A step of forming a multilayer film 20Z by stacking a pinning layer 22, SyAF pinned layer 23, tunnel barrier layer 24, free layer 25, and antiferromagnetic bias layer 26 in order on the bottom shielding layer 13.

(C) A step of selectively forming a photoresist pattern 61 on the multilayer film 20Z so as to protect an area that defines an element width.
(D) A step of forming the TMR film 20 by selectively etching the multilayer film 20Z using the photoresist pattern 61 as a mask.
(E) A step of selectively forming an insulating layer and a ferromagnetic layer then removing the photoresist pattern 61 so as to form a pair of ferromagnetic bias layers 16 with the insulating layer 17 in between.
(F) A step of forming the insulating layer 18 on the pair of ferromagnetic bias layers 16.
(G) A step of forming the top shielding layer 15 to cover the whole surface after removing the photoresist pattern 61.

Hereafter, details of the respective manufacturing steps will be explained.

Figure 7:
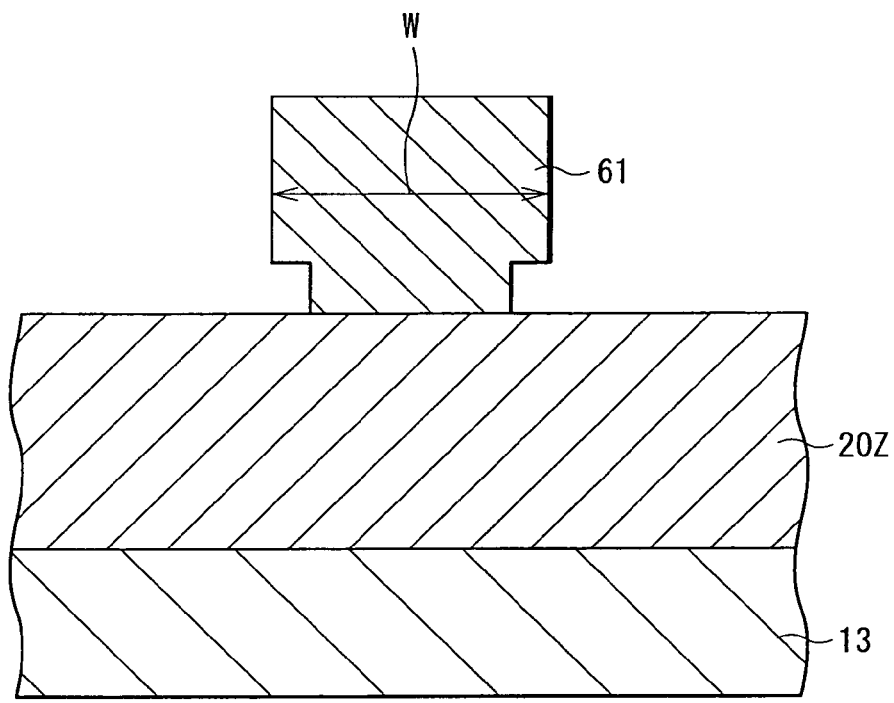
FIG. 7 is a principal portion sectional view showing one production step in the method of manufacturing the thin film magnetic head of FIG. 1.

First, as shown in FIG. 7, the multilayer film 20Z is formed to cover the whole surface of the bottom shielding layer 13, which is formed on one side surface of the substrate 11. Specifically, the foundation layer 21, the pinning layer 22, the SyAF pinned layer 23, the tunnel barrier layer 24, the free layer 25, and the antiferromagnetic bias layer 26 are stacked in order by sputtering or the like. The tunnel barrier layer 24 is, for example, formed in such a manner that a magnesium layer or aluminum layer is formed on the SyAF pinned layer 23 under fully deoxygenated atmosphere at first, then oxidized to form a metal oxide film under oxygen atmosphere. The multilayer film 20Z is a film to be processed into the TMR film 20 in the following step. Although internal configuration of the TMR film 20 and the multilayer film 20Z in its manufacturing process are not illustrated in FIGS. 7 to 10, they are all configured to correspond to the TMR film 20 shown in FIG. 5.

Subsequently, the photoresist pattern 61 is selectively formed on the multilayer film 20Z with a width W so as to correspond to a portion that defines the element width. Here, the photoresist pattern 61 may be partially removed using a specified solvent to form an undercut portion.

Figure 8:
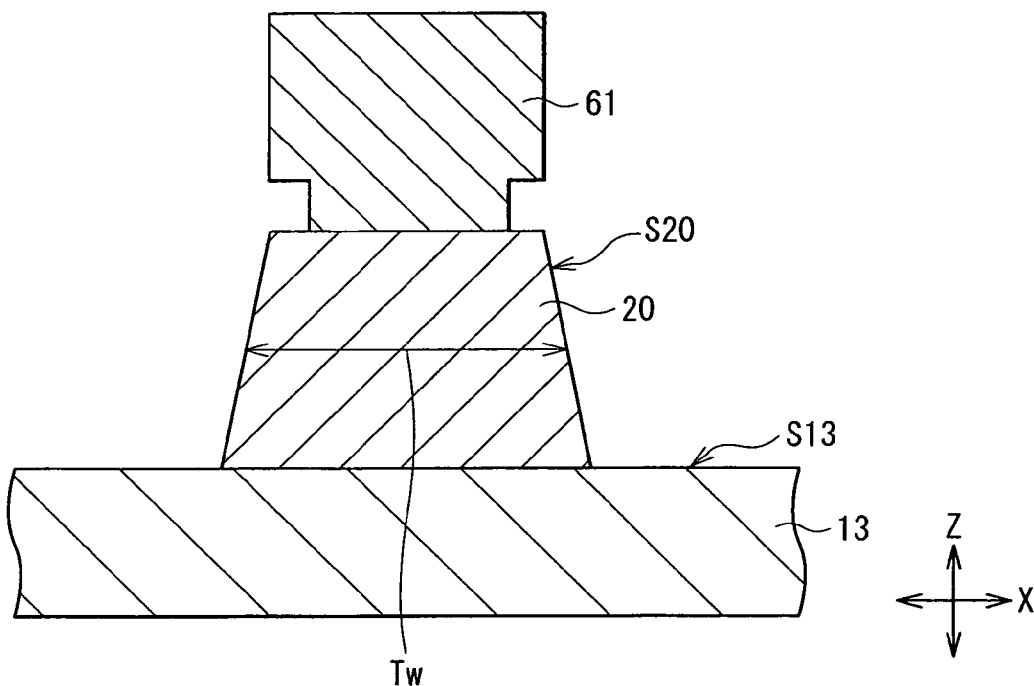
FIG. 8 is a principal portion sectional view of a step subsequent to FIG. 7.
Figure 9:
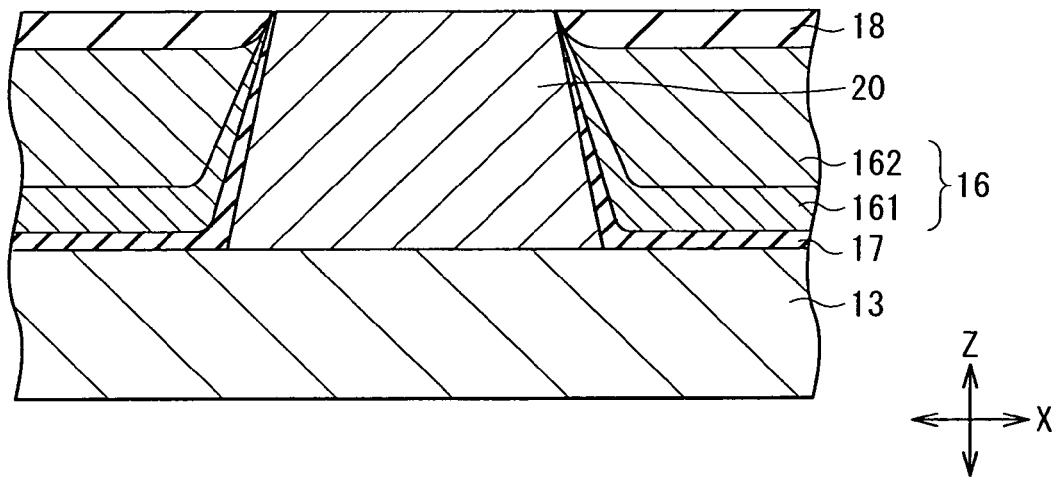
FIG. 9 is a principal portion sectional view of a step subsequent to FIG. 8.

Subsequently, the multilayer film 20Z is selectively removed by dry etching such as ion milling and RIE, for example, using the photoresist pattern 61 as a mask. Here, dry etching is conducted to reach the bottom shielding layer 13. As a result, the TMR film 20 having the width Tw is formed as shown in FIG. 8. The width Tw is an average element width for the TMR film 20. After forming the TMR film 20, the pair of insulating layers 17 and the pair of ferromagnetic bias layers 16 are formed on both sides of the TMR film 20 in the direction of X to adjoin the TMR film 20, as shown in FIG. 9. Specifically, the insulating layer 17, the foundation layer 161 and the magnetic domain controlling layer 162 are formed in order on all over the surface by sputtering etc., for example. Then, the insulating layer 18 is formed by sputtering on the ferromagnetic bias layer 16. Subsequently, the photoresist pattern 61 is lifted off, thereby appearing the TMR film 20, the pair of insulating layers 17 facing each other with the TMR film 20 in between, and the pair of ferromagnetic bias layers 16 constituted from the foundation layer 161 and the magnetic domain controlling layer 162. The TMR element 14 is thus obtained.

Figure 10:
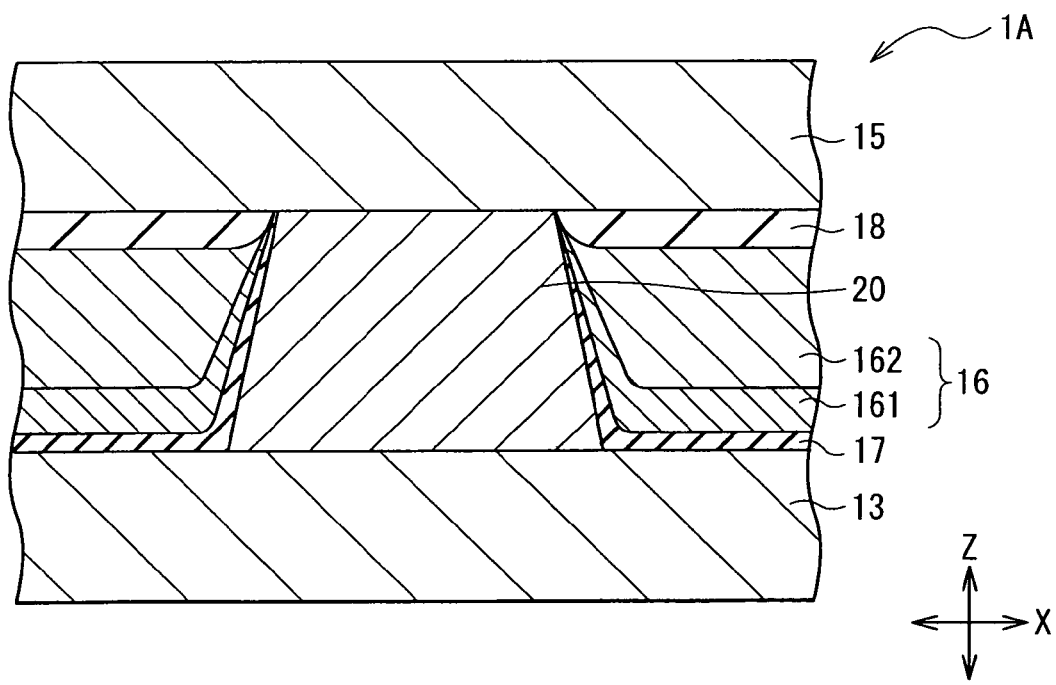
FIG. 10 is a principal portion sectional view of a step subsequent to FIG. 9.

After removing the photoresist pattern 61, the top shielding layer 15 is formed to cover the whole surface as shown in FIG. 10. Then, the read head section 1A is generally completed.

Subsequently, the insulating layer 19, the lower magnetic pole 31 and the write gap layer 32 are formed in order on the read head section 1A, and the coil 34 is selectively formed on the write gap layer 32. After this, the write gap layer 32 is partially etched to form the opening 32A. Then, the insulating layer 35 is formed to cover the coil 34, and after that, the pole chip 33 and the connection point 36 are sequentially formed. Further, the upper magnetic pole 37 is formed to cover the pole chip 33, the coil 34, the insulating layer 35 and the connection point 36. It is preferred that the upper magnetic pole 37 is formed by a frame plating process.

Finally, a protective film (not shown in the figure) is formed by sputtering or the like to cover the whole surface including the upper magnetic pole 37, then a planarization procedure is applied as necessary by a CMP process or the like. That is the end of the formation process for the write head section 1B, thus the thin film magnetic head 1 is generally completed.

Thus, according to the present embodiment, the free layer 25 and the antiferromagnetic bias layer 26 in the TMR film 20 are exchange-coupled at the exchange-coupling magnetic field Hex that is smaller than the saturation magnetic field Hs applied to the free layer 25. Namely, the curve which represents variation in the magnetization of the free layer 25 versus the signal magnetic field includes the first magnetic field range I with a maximum gradient and the second magnetic field range II including the zero magnetic field and showing a smaller gradient value than the first magnetic field range I (with reference to FIG. 6A). Accordingly, the responsiveness of the TMR film 20 is low in the second magnetic field range II of a comparatively low magnetic field, and the magnetization direction of the free layer 25 is stabilized. Meanwhile, in the first magnetic field range I of a comparatively high magnetic field exceeding the exchange-coupling magnetic field Hex, magnetization of the free layer 25 may respond sensitively to the signal magnetic field Heff without being restricted by the antiferromagnetic bias layer 26. Namely, the TMR element 14 according to the present embodiment is hardly susceptible to harmful influence of unnecessary magnetic fields and noise of heat even when reduction in size is achieved. What is more, the signal magnetic field Heff may be precisely detected if the signal magnetic field Heff of a certain strength or above is given to the free layer 25. As a result, the thin film magnetic head, magnetic head slider, head gimbal assembly, head arm assembly and a magnetic disk device provided with the TMR element 14 according to the present embodiment are adaptable to higher recording density and excellent in operational reliability.

EXAMPLE 1

Here, sample corresponding to the TMR element 14 according to the above-mentioned embodiment was made to investigate its output characteristics. Specifically, the sample TMR film was produced with the following configuration, and output voltage Vout with respect to applied magnetic fields H was measured under quasi-static test. The result is shown in FIG. 11.

Pinning layer: IrMn (10 nm thick)
SyAF pinned layer: CoFeB (3 nm thick)\Ru (0.8 nm thick)\CoFeB (2 nm thick)
Tunnel barrier layer: MgO (2.0 nm thick)
Free layer: CoFe (1.0 nm thick)\NiFe (4.0 nm thick)
Antiferromagnetic bias layer: IrMn (10 nm thick)

Figure 11:
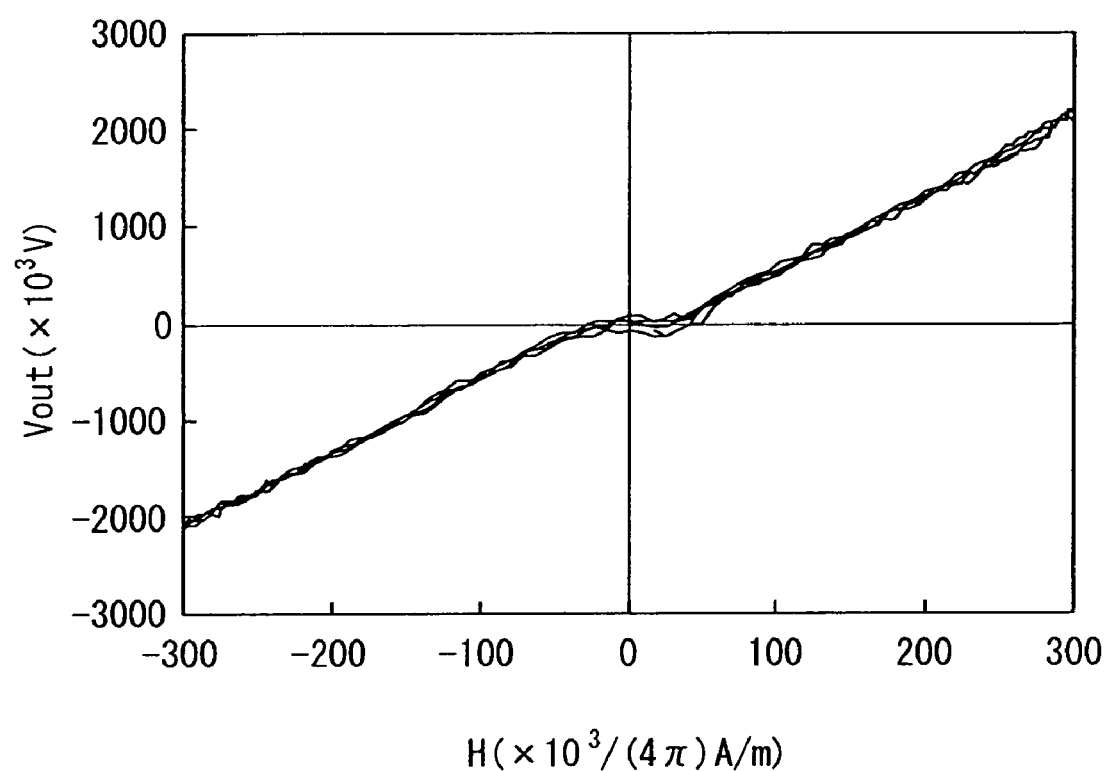
FIG. 11 is a characteristic chart showing the relationship of applied magnetic field and output voltage in an MR element of the present embodiment.

As shown in FIG. 11, it was confirmed in the present example that the output voltage Vout did not change so much in a magnetic field range till around $50*10^3/(4\pi)$ [A/m] (the second magnetic field range II), and the relationship between output voltage Vout and applied magnetic field H was linear in the range out of that (the first magnetic field range I). Namely, the exchange-coupling magnetic field Hex between the free layer and the antiferromagnetic bias layer was presumed to be around $50*10^3/(4\pi)$ [A/m].

Although the present invention has been described with reference to the above embodiment and examples, the invention is not limited to the embodiment and examples but can be variously modified. For example, although the TMR element was mentioned as an example of MR elements in the above-mentioned embodiment, it is not limited to this and CPP-GMR element and CIP-GMR element may be used.

Further, although the magnetoresistive element of an embodiment of the present invention is applied to a thin film magnetic head to be equipped in a magnetic disk device according to the above-mentioned embodiment, it is not limited to this. The magnetoresistive element of an embodiment of the present invention may serve as a memory device provided in a digital sensor by which the presence of a current or magnetic field of a certain strength or above is detected (for example, a count sensor that counts the number of rotation etc. of a body through variation in magnetic field) and magnetic random-access memory (MRAM).

Association of reference numerals and component elements in the present embodiment is shown below.

1: thin film magnetic head,
1A: read head section,
1B: write head section,
2: head gimbal assembly (HGA),
2A: slider,
2B: suspension,
3. arm,
4: actuator,
5: fixed axle,
6: bearing,
7: spindle motor,
11: substrate,
11S: recording-medium-facing-surface (ABS),
12: insulating layer,
13: bottom shielding layer,
13P, 15P: pad,
14: tunnel magnetoresistive effect (TMR) element,
15: top shielding layer,
16: ferromagnetic bias layer,
17, 18,
19: insulating layer,
20: TMR film,
21: foundation layer,
22: pinning layer,
23: SyAF pinned layer,
24: tunnel barrier layer,
25: free layer,
26: antiferromagnetic bias layer,
31: lower magnetic pole,
32: write gap layer,
32A: opening,
33: pole chip,
34: coil,
34A, 34B: coil lead,
34S, 34E: pad,
35: insulating layer,
36: connection point,
37: upper magnetic pole,
100: housing,
200: magnetic recording medium,
300: head arm assembly (HAA).

What is claimed is:

1. A magnetoresistive element comprising a stacked structure, the stacked structure including, in order:
   a magnetically pinned layer whose magnetization direction is fixed in a given direction;
   a non-magnetic layer;
   a magnetically free layer whose magnetization direction changes according to an external magnetic field; and
   an antiferromagnetic bias layer exchange-coupled with the magnetically free layer, an exchange-coupling magnetic field between the magnetically free layer and the antiferromagnetic bias layer being smaller than a saturation magnetic field of the magnetically free layer, the antiferromagnetic bias layer being in direct contact with the magnetically free layer,
   wherein a curve which represents a variation in magnetization of the magnetically free layer versus an external magnetic field includes a first magnetic field range and a second magnetic field range, the first magnetic field range being defined as a range from the saturation magnetic field via a portion with a maximum gradient of magnetic field variation to the exchange-coupling magnetic field, the second magnetic field range being defined as a range from the exchange-coupling magnetic field to zero magnetic field, a gradient in the second magnetic field range being smaller than that of the first magnetic field range.

2. The magnetoresistive element according to claim 1, further comprising a pair of ferromagnetic bias layers arranged to face each other, along a stacking plane, with the stacked structure in between so as to apply a bias magnetic field to the magnetically free layer.

3. A thin film magnetic head comprising:
   a magnetoresistive element according to claim 1, and
   a pair of magnetic shielding layers arranged to face each other, in a stacking direction, with the magnetoresistive element in between.

4. A magnetic head slider with a thin film magnetic head mounted on a substrate, the thin film magnetic head comprising:
   a magnetoresistive element according to claim 1, and
   a pair of magnetic shielding layers arranged to face each other, in a stacking direction, with the magnetoresistive element in between.

5. A head gimbal assembly, comprising:
   a magnetic head slider with a thin film magnetic head mounted on a substrate; and
   a suspension attached to the magnetic head slider on one end of the suspension,
   wherein the thin film magnetic head includes:
   a magnetoresistive element according to claim 1, and
   a pair of magnetic shielding layers arranged to face each other, in a stacking direction, with the magnetoresistive element in between.

6. A head arm assembly comprising:
   a magnetic head slider with a thin film magnetic head mounted on a substrate;
   a suspension attached to the magnetic head slider on one end of the suspension; and
   an arm supporting the other end of the suspension,
   wherein the thin film magnetic head includes:
   a magnetoresistive element according to claim 1, and
   a pair of magnetic shielding layers arranged to face each other, in a stacking direction, with the magnetoresistive element in between.

7. A magnetic disk device, comprising;
   a magnetic recording medium;
   a magnetic head slider with a thin film magnetic head mounted on a substrate;
   a suspension attached to the magnetic head slider on one end of the suspension; and
   an arm supporting the other end of the suspension,
   wherein the thin film magnetic head includes:

a magnetoresistive element including a stacked structure, and a pair of magnetic shielding layers arranged to face each other, in a stacking direction, with the magnetoresistive element in between;

the stacked structure having, in order:

a magnetically pinned layer whose magnetization direction is fixed in a given direction;

a non-magnetic layer;

a magnetically free layer whose magnetization direction changes according to a signal magnetic field applied from the magnetic recording medium; and an antiferromagnetic bias layer exchange-coupled with the magnetically free layer, an exchange-coupling magnetic field between the magnetically free layer and the antiferromagnetic bias layer being smaller than a saturation magnetic field of the magnetically free layer, the antiferromagnetic bias layer being in direct contact with the magnetically free layer, wherein a curve which represents a variation in magnetization of the magnetically free layer versus the signal magnetic field includes a first magnetic field range and a second magnetic field range, the first magnetic field range being defined as a range from the saturation magnetic field via a portion with a maximum gradient of magnetic field variation to the exchange-coupling magnetic field, the second magnetic field range being defined as a range from the exchange-coupling magnetic field to zero magnetic field, a gradient in the second magnetic field range being smaller than that of the first magnetic field range.

8. The magnetic disk device according to claim 7, wherein a peak value of a reproduced waveform representing a temporal variation in the signal magnetic field is higher than the exchange-coupling magnetic field.

9. A magnetoresistive element comprising a stacked structure, the stacked structure including, in order:

a magnetically pinned layer whose magnetization direction is fixed in a given direction;

a non-magnetic layer;

a magnetically free layer whose magnetization direction changes according to an external magnetic field; and an antiferromagnetic bias layer exchange-coupled with the magnetically free layer, wherein a curve which represents a variation in magnetization of the magnetically free layer versus the signal magnetic field includes a first magnetic field range and a second magnetic field range, the first magnetic field range being defined as a range from the saturation magnetic field via a portion with a maximum gradient of magnetic field variation to a relay point, the second magnetic field range being defined as a range from the relay point to zero magnetic field, gradient in the second magnetic field range being smaller than that of the first magnetic field range, the antiferromagnetic bias layer being in direct contact with the magnetically free layer.

10. The magnetoresistive element according to claim 9, wherein magnitude of a magnetic field at the relay point is equal to magnitude of an exchange-coupling magnetic field between the magnetically free layer and the antiferromagnetic bias layer.

11. A magnetic disk device, comprising:

a magnetic recording medium;

a magnetic head slider with a thin film magnetic head mounted on a substrate;

a suspension attached to the magnetic head slider on one end of the suspension; and an arm supporting the other end of the suspension, wherein the thin film magnetic head includes:

a magnetoresistive element including a stacked structure, and a pair of magnetic shielding layers arranged to face each other, in a stacking direction, with the magnetoresistive element in between;

the stacked structure having, in order:

a magnetically pinned layer whose magnetization direction is fixed in a given direction;

a non-magnetic layer;

a magnetically free layer whose magnetization direction changes according to a signal magnetic field applied from the magnetic recording medium; and an antiferromagnetic bias layer exchange-coupled with the magnetically free layer, an exchange-coupling magnetic field between the magnetically free layer and the antiferromagnetic bias layer being smaller than a saturation magnetic field of the magnetically free layer, the antiferromagnetic bias layer being in direct contact with the magnetically free layer, wherein a peak value of a reproduced waveform representing a temporal variation in the signal magnetic field is higher than the exchange-coupling magnetic field.

* * * * *